us009151791B2

(12) United States Patent
Roziere

(10) Patent No.: US 9,151,791 B2
(45) Date of Patent: Oct. 6, 2015

(54) CAPACITIVE CONTROL INTERFACE DEVICE HAVING DISPLAY INTEGRATION

(71) Applicant: NANOTEC SOLUTION, Nimes (FR)

(72) Inventor: Didier Roziere, Nimes (FR)

(73) Assignee: Nanotec Solution, Nîmes (FR)

( * ) Notice: Subject to any disclaimer, the term of this patent is extended or adjusted under 35 U.S.C. 154(b) by 143 days.

(21) Appl. No.: 14/082,678

(22) Filed: Nov. 18, 2013

(65) Prior Publication Data

US 2014/0070823 A1 Mar. 13, 2014

Related U.S. Application Data

(63) Continuation of application No. 13/388,627, filed as application No. PCT/FR2010/051669 on Aug. 6, 2010, now Pat. No. 9,000,782.

(30) Foreign Application Priority Data

Aug. 7, 2009 (FR) ...................................... 09 55584

(51) Int. Cl.
*G01R 27/26* (2006.01)
*G06F 3/044* (2006.01)
(52) U.S. Cl.
CPC ............ *G01R 27/2605* (2013.01); *G06F 3/044* (2013.01)

(58) Field of Classification Search
CPC ........................... G01R 27/2605; G01F 3/044
USPC ............ 324/688, 600, 500, 518, 519, 750.17, 324/754.28, 548, 658, 661, 686, 76.66
See application file for complete search history.

(56) References Cited

U.S. PATENT DOCUMENTS 6,847,354 B2 1/2005 Vranish
7,570,064 B2 8/2009 Roziere

FOREIGN PATENT DOCUMENTS

FR 2756048 5/1998
FR 2896595 7/2007

*Primary Examiner* — Melissa Koval
*Assistant Examiner* — Trung Nguyen
(74) *Attorney, Agent, or Firm* — Greer, Burns & Crain, Ltd.

(57) ABSTRACT

A capacitive detection control interface device is provided, including at least one measurement electrode including an active surface, a guard made from an electrically conductive material placed adjacent to the measurement electrodes, the guard is excited up to an alternating electric potential substantially identical to that of the measurement electrodes, a first electronic component for exciting the electrodes and processing the measurement signals from the capacitive coupling of the electrodes with an object laced adjacent thereto, the electronic component is at least partly referenced to the electric potential of the guard, and a second electronic component for performing another functional display, placed adjacent to the active surface which second electronic component is at least partly referenced to the electric potential of the guard.

16 Claims, 3 Drawing Sheets

CAPACITIVE CONTROL INTERFACE DEVICE HAVING DISPLAY INTEGRATION

RELATED APPLICATION

This application is a Continuation-In-Part of, and claims 35 USC 120 priority from, U.S. patent application Ser. No. 13/388,627 filed Aug. 6, 2010.

TECHNICAL FIELD

The present invention relates to a capacitive device for detecting a body or an object in a detection space, enabling integrating other electronic functions. This capacitive device can in particular be a device for control interface, in particular gestural and/or tactile possibly combined to a vocal control, sensitive to a movement of a body or of an object or voice. It also aims at a method for control interface implemented in this device, as well as a control equipment implementing such a device.

The field of the invention is more particularly, but not limited to, gestural and/or tactile and possibly vocal man-machine interfaces, enabling movements of the body, hand, finger or an object to be interpreted in real time, at a long distance to the touch, these movements being combined or not to a vocal request in order to perform one or more controls.

BACKGROUND

It is more and more attempted in virtual interfaces to have a proximity detection function, which enables new man-machine interaction modes to be created without any contact. Sensors must then be able to detect displacements or shapes within several centimetres, in a sufficiently accurate and determined manner to be able to transform them into controls.

More generally, so-called virtual, that is gestural and/or tactile and vocal man-machine interfaces, as opposed to interfaces where the user acts on mechanical sensors such as keyboard keys or switches, are most often 3D cameras in the field of gestural interface and active surfaces, often transparent and integrated on the display screens, in the field of tactile interface. These tactile interfaces are widespread under the name of "touchpad" for multiple industrial and consumer applications, such as for example smartphones, home automation or game interfaces.

The screen enables to display for example a keyboard or the software interface the image of which varies in response to actions from the user, which generally consist of a displacement, a tapping or even a prolonged contact of the finger or a stylus onto the screen surface in order to perform controls.

More recently, so-called gestural interfaces have been developed to meet the increasingly great complexity of digital products emanating from the convergence of communication and entertainment information technologies. These interfaces are most often based on a 3D camera and an image processing capable of interpreting at a long distance, up to 5 metres, the movements of the body or the hand to interact with the screen.

Among virtual controls, can also be mentioned the vocal control which enables the request to be performed from the voice.

Among existing tactile technologies, capacitive technologies are frequently used because:

they do not require exerting any mechanical action onto the screen surface unlike resistive techniques for example, they are well-adapted to the meshing of the screen surface by a sensor network directly integrated to the surface thereof, which enables a much more compact and robust integration than with optical techniques for example which require a network of transmitters-receivers raised with respect to the detection surface.

It is more and more attempted in virtual interfaces to have a proximity detection function, which enables new man-machine interaction modes to be created without any contact. Sensors must then be able to detect displacements or shapes within several centimetres, in a sufficiently accurate and determined manner to be able to transform them into controls.

If optical technologies can not be dispensed with when accurately detecting movements at a very long distance (beyond 40 centimetres), capacitive technologies turn out to be very well adapted to interfaces without proximity contact, in particular because all sensors can be integrated to a non-planar active surface, for example a screen, without dead area or without requiring external devices (cameras).

Amongst capacitive tactile interfaces, the most used techniques are generally based on the charge transfer principle. They enable sensitivity in the order of one picofarad to be obtained but they are not adapted to make a gestural interface. Indeed, their sensitivity does not enable the approach of a finger to be detected because the capacity generated does not then exceed a few hundredths picofarads. Stray capacitances present in this type of sensor and in electronics prevent any sensitivity improvement.

Moreover, these techniques are very sensitive to electromagnetic disturbances, stray electrical charges and electric conduction of the dielectric covering the electrodes. When the air relative humidity is higher than 60%, most dielectrics become slightly electrically conducting and charges generated by the electronics are modified, which disturbs the capacitive measurement.

Among technical solutions employed to make non-tactile capacitive interfaces, some are known which implement a pseudoguard enabling the stray capacitances to be strongly reduced in the sensor and electronics. However, these techniques only enable at most one order of magnitude on sensitivity to be gained, which enables the presence of a finger to be detected at only a few mm of the sensitive surface of the sensor.

Regarding capacitive gestural interfaces, it is known from document U.S. Pat. No. 6,847,354 to Vranish, capacitive sensors implemented with an active guard. This active guard is created using a unity gain amplifier which generates in the guard a voltage with an amplitude identical to that of the measurement electrode.

The drawback of this method is that the electronics generates by a physical principle stray capacitances which correspond to the sum of the input capacitances of the amplifier to generate the active guard, also called pseudoguard, and of the circuit to excite the measurement electrode. These stray capacitances easily reach one picofarad and add up to the capacitance to be measured, which only represent one hundredth of this total value.

Moreover, the capacitance measurement is not direct because the Vranish electronics obtains the image of the capacitance to be measured by measuring its current via a reference resistor. This resistor generates a stray phase shift of the electrical current which strongly degrades the detection quality, or of demodulation of the signal representing the capacitance to be measured. Another drawback is the crosstalk level between different electrodes. Indeed, each electrode is excited by an operational amplifier the gain of which is approximately a unity one. Any gain deviation between different amplifiers causes a high further stray capacitance.

These drawbacks do not enable the position of an object such as a finger or a hand to be detected and located at several centimetres or even tens of centimetres with each sensor.

On the other hand, capacitive technologies implemented for making gestural interfaces have been developed most often in an attempt to be integrated to screens or at least substantially planar surfaces. The structures of sensors are arrays, as in U.S. Pat. No. 6,847,354, and interfaced with electrode structures disposed as a grid X-Y. These technologies are poorly adapted to the instrumentation of surfaces with more complex shapes.

In particular, they are hardly applicable to devices for virtual controls or gestural interfaces based not on an instrumented planar surface but on other types of geometries including cavities, reliefs, undulations simulating for example keys, buttons or wrapping the user wherein sensors can be disposed as various geometries, sometimes under dielectric materials with a high thickness, and must sometimes be able to be disposed and managed independently of one another.

More generally, the sensor devices for virtual interfaces are usually in the form of a detection array fastened to the front face on a viewing screen the display of which behaves as a function of actions from the user. The control electronics of the screen is placed at the rear of the sensor, and the measurement electrodes are protected from electric disturbances by the active guard.

The application field of these virtual interfaces is not restricted to screen instrumentation but can advantageously be extended to the equipment of keyboards, panels, etc. with various shapes which can be gathered as active surfaces. It is thus desirable to integrate further functions to these active surfaces, such as for example a lighting, tactile feedback devices, displays, to confirm a control command or accompany the user.

Integrating these electric functions at the capacitive electrodes, without degrading the capacitive measurement, is a major issue. In devices of prior art, these functions can only be performed by means of electrical and electronic circuits referenced to an electric ground identical to that of the target object. Consequently, all the circuits are seen by the capacitive electrodes also as target objects, which strongly disturb and degrade the sensitivity of the capacitive sensor.

Document FR2884349 to Roziere is known, which discloses a system based on capacitive sensors including a single measurement electrode. The device enables objects to be detected beyond 10 cm with each electrode, thanks to a floating bridge electronics. The measurements from the electrodes are sequentially read by means of a scrutinising system. However, this device, intended to equip walls of movable instruments, is specifically designed to cover anti-collision applications, and does not cover the gestural interface applications. For the purpose of restricting to the most the stray capacitances giving rise to disturbances, this electronics has the feature to include a floating part referenced to the alternating potential of the guard, which is identical to that of the electrode.

The purpose of the present invention is to provide a capacitive device for detecting a body or an object in a detection space, able to integrate complementary functions at the electrodes without the performances of the capacitive measurement being notably altered.

SUMMARY

This purpose is achieved with a capacitive detection device including:
at least one measurement electrode including an active surface,
a guard made from an electrically conductive material placed adjacent to said measurement electrode(s), which guard is excited up to an alternating electric potential substantially identical to that of the measurement electrodes,
first electronic means for exciting the electrode(s) and processing the measurement signals from the capacitive coupling of said electrode(s) with an object placed adjacent thereto, which electronic means are at least partly referenced to the electric potential of the guard.

According to the invention, this detection device further includes:
means for performing another function, placed adjacent to said active surface, and
second electronic means provided for monitoring said means for performing another function, which second electronic means are at least partly referenced to the electric potential of the guard.

Advantageously, the processing of the measurement signals can provide information about the distance between the active surface of the electrodes and the object.

Detectable objects with a device according to the invention are capacitively detectable objects, that is substantially electrically conductive and able to make up an electrical ground. These objects are not necessarily connected to the ground through an electrical connection, but they can naturally be through capacitive coupling. There can be mentioned, by way of non-limiting examples, a living being, a hand, a finger or a stylus of conductive material held in hand.

According to a particularly advantageous aspect of the device according to the invention, the floating bridge electronics described in FR2756048 (the first electronic means) is modified so as to integrate further electronic functions (the second electronic means) referenced to the potential of the guard. Thus, the electronic components performing these functions can be physically integrated in close vicinity to the measurement electrodes without disturbing the measurement because, since they are at the potential of the guard, they are "seen" by the electrodes as if they were part of the guard. This implementation mode is obviously only possible when the control electronics of the capacitive sensors includes a fully floating part, which is not the case in the other devices. Thus, for example in U.S. Pat. No. 6,847,354, the guard is substantially placed to the same potential as the electrodes by means of a unity gain amplifier, but the same is referenced to the general ground as the rest of the electronics.

A device according to the invention can include a plurality of electrodes with a size enough to achieve the desired detection distance. These electrodes can be protected at the rear by a guard screen maintained at an electric potential substantially identical to that of the electrodes, in order to restrict or remove all the stray capacitances that can be superimposed to the capacitance created between the aimed object and the electrodes. This guard is generated by a so-called floating electronics which has the feature to generate an extremely efficient guard. Thereby, the electronics only measures the capacitance generated between the target object and the electrode without being impeded by stray capacitances existing in the sensor and electronics, and the range and sensitivity of the device can be particularly great.

According to particular embodiments, the first electronic means can comprise scrutinising means enabling the measurement signals emanating from the capacitive sensors to be sequentially read. The electrodes which are not currently under scrutinising can advantageously be connected to the potential of the guard.

In this embodiment, the electrodes are sequentially selected in order to limit the number of components and the energy consumption. Connecting the electrodes which are not currently under scrutinising to the potential guard enables the electrostatic edge effects of the measuring electrodes to be reduced at the most.

According to other embodiments requiring more components, each electrode can be connected to an electronic circuit so as for example a charge amplifier. These electronic circuits are referenced to the floating electric potential, thus to that of the guard, which enables the advantageous property that each electrode is seen as a guard for its neighbours is preserved. This solution enables the measurement rate to be increased because the capacitances or distances can be measured in parallel on all the electrodes.

It is of course possible to implement other modes for scrutinising electrodes, such as for example a reading by group.

According to particular embodiments, the electronic means can comprise means for electrically gathering measurement electrodes, such that said gathered electrodes make up a single measurement electrode.

It is thus possible to create electrodes with a higher area, enabling the measurement extent to be increased to detect objects at a higher distance. The configuration of electrode groups can of course be electronically performed. The measurement electrodes can for example be gathered when the object is far from the panel device in order to favour the measurement extent, and split when the object is close to the electrodes in order to favour the spatial resolution and accuracy of the three-dimensional position of the object.

According to particular embodiments, the electronic means referenced to the electric potential of the guard can be powered by a power supply comprising at least one of the following elements: a DC/DC converter and a choke coil, the second electronic means can include decoupling means, such that at the guard excitation alternating electric potential frequency, they appear as being substantially at this same potential.

The floating capacitive electronics is based on the principle which is to power at least one part of the electronics with a floating voltage. This voltage can be generated for example by a DC/DC voltage converter which has a good galvanic insulation. It can also be generated by coupling a power supply through choke coils which, at the excitation frequency of the sensor, behave as high impedances insulating the floating part of the reference ground from the target object, while the direct current can pass for powering the floating electronic circuit.

When electric functions are added as for example a lighting through light emitting diodes (LED), a liquid crystal display (LCD) adjacent to the electrodes, or any (optical . . . ) measurement sensor, it is necessary to connect these circuits to the same guard potential as the capacitive sensor in order to avoid any capacitive disturbance.

Indeed, if such electric circuits were referenced for example to the external ground potential (potential close to that of the object or the finger), the field lines of the electrodes would be very rapidly absorbed by these circuits and the range of the electrodes would not enable a contactless detection to be performed.

To power these additional circuits, for example the same DC/DC converter or the same power supply decoupled by choke coils as for the floating electronics of the capacitive sensors can be used, or even one or more DC/DC converters can be added by making a point of connecting the zero volt outputs of all the converters between them.

To provide an optimum operation, it is preferable that all the potentials of the electrical circuits added be perfectly referenced to the guard potential. To do this, all the electronic circuits which manage these new functions should be equivalent to Thevenin generators (that is pure voltage sources) at the excitation frequency of the sensor. Thereby, there can not be capacitive leakages between the floating capacitance meter (that is the interface circuit of the capacitive measurement electrodes) and the other functions. To do this, for example circuits with a low output impedance can be used, or decoupling capacitances can be inserted.

For example, in the case of a light emitting diode (LED) controlled by a conventional digital circuit, one of the pins of the LED is connected to the guard whereas the second one is connected to the output of the control digital circuit. This control circuit is itself substantially equivalent to a Thevenin generator. As a precaution, a decoupling capacitance can also be added in parallel with the LED, in order to remove any residual voltage at the excitation frequency at its terminals.

With this principle, it is also possible to manage complex and energy consuming functions such as a LCD screen, an electric motor, a camera, a lighting, or measurement functions such as a temperature probe.

The floating part of the electronics can communicate with external systems referenced for example to the general ground through decoupling means. These decoupling means can include for example differential amplifiers, optocouplers or choke coils.

According to an advantageous aspect of the device according to the invention, these further electronic functions can be used as a guard at the measurement electrodes. Indeed, since they are referenced to the guard, they not only do not disturb the capacitive measurement, but also they enable the equivalent area of the guard at the capacitive sensor to be increased, which helps to improve the range and/or the sensitivity of the measurement electrode. It is thereby possible to place functions on the measuring part (the active face) side of the electrodes.

According to particular embodiments, at least one part of the electronic means referenced to the electric potential of the guard can be integrated on the same support as the measurement electrodes, at least one part of the electronic means referenced to the electric potential of the guard can be substantially disposed in a plane consisting of the active surface of at least one part of the measurement electrodes, the device according to the invention can include a printed circuit type support, one face of which includes measurement electrodes and the other face of which includes a guard, the printed circuit can be flexible or rigid, with a shape adapted to particular embodiments, the device according to the invention can include a dielectric material disposed on the active surface side of the measurement electrodes, the second electronic means can include at least one element from an indication means and a measurement means.

These additional electronic means can indeed include sensors for collecting information complementary to the capacitive measurements, as well as actuators or other devices for providing information to the user or adapting the interface aspect.

Advantageously, by way of non-limiting examples, the second electronic means can include at least one element from:
a light emitting diode based illumination means,
a liquid crystal (LCD) or organic light emitting diode (OLED) based display,
a piezoelectric tactile feedback means,
an audible annunciator,
a CCD or CMOS type optical imaging sensor,
a temperature sensor,
a humidity sensor,
an atmospheric pressure sensor,
a photodiode type brightness sensor.

A device according to the invention enables any moving machine type to be equipped or its displacement with respect to its environment to be monitored. It also enables the position or movements of a person to be determined.

According to another aspect, it is provided a control equipment ensuring a man-machine interface function integrating a device according to the invention.

This control equipment can have the form of a planar monitoring panel or any form allowing an optimized integration to achieve the highest aesthetics or ergonomics. It can for example be of a spherical or half-spherical shape to mimic a computer mouse. It enables all or part of the control electromechanical buttons to be replaced, for example for reliability and design reasons.

With a device according to the invention, the position of a finger or an object in space up to several centimetres can be measured in a contactless manner, and the contact and the pressure of the finger or object onto a control panel or a keyboard can be detected, even through any dielectrics.

The control panel can be equipped with an actuator to give a physical feedback. These actuators can also be connected to the guard potential.

It is thus possible to make virtual, adaptive keyboards providing the user with a very advanced, futuristic and ergonomic perception with original control combination possibilities. These keyboards can be made of a great variety of dielectric materials providing for example particular touch qualities.

Generally, the electrodes are juxtaposed to each other in order to avoid dead areas on the panel. Dead areas where the electrode is replaced by a guard or another function such as a LED can thereby be intentionally created.

For example, a LED can be placed in the centre of each capacitive electrode in order to indicate to the user where each electrode is. This LED can be switched on as soon as the electronics detects at some distance that a finger or any object approaches.

A LCD or OLED screen can also be added. All these electric circuits and components are referenced to the same potential as that of the capacitive electronics, which removes the risk of disturbing the operation of the electrodes.

According to another aspect, it is provided an environment monitoring method implementing a device according to the invention, including at least one distance between an object and capacitive measurement electrodes placed adjacent to a guard excited up via a first electronics to an alternating electric potential substantially identical to that of said measurement electrodes, characterised in that it further includes performing a further function implementing a second electronics at least one part of which is connected to the electric potential of said guard.

The further function can in particular:
be determined at least from distance measurements,
include at least one interaction from reading a measurement means and activating an indication means.

Advantageously, the method can further include a step of determining controls, which controls are conditioned by at least one of the following steps:
measuring distances between the measurement electrodes and the object, and
reading second electronic means.

The method and device thereby allow, by way of non-limiting examples, to detect the approach of the user, in particular the user type and the approach mode, and to selectively light the parts of the control board towards which it is directly or to which it is allowed to access. The user can be identified also using sensors different from the capacitive sensors (camera). The lighting can also be adjusted depending on the measured ambient brightness. Sensors for measuring physical properties can be activated and interrogated only when the capacitive sensors detect the passage of an object.

BRIEF DESCRIPTION OF THE DRAWINGS

Other advantages and features of the invention will appear upon reading the detailed description of implementations and embodiments in no way limiting, and the following appended drawings wherein.

DETAILED DESCRIPTION

Figure 1:
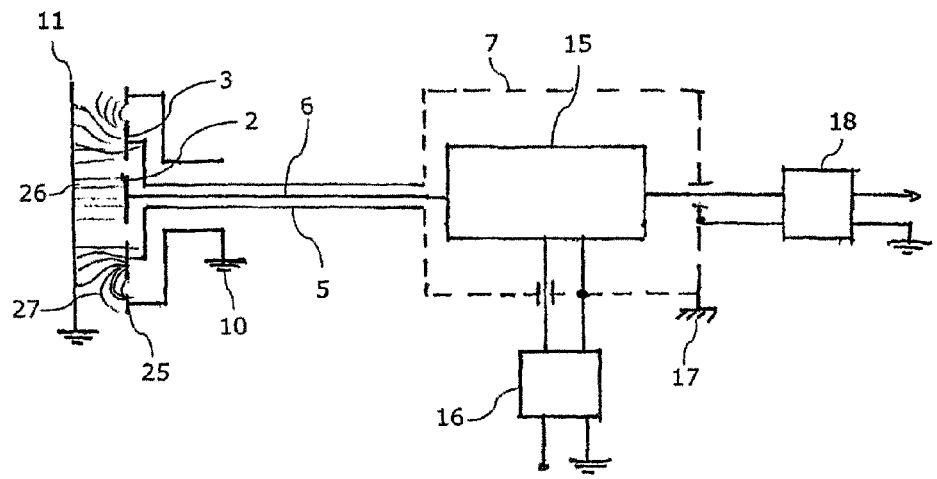
FIG. 1 illustrates the structure of the electric field lines of a triaxial capacitive sensor, according to a representative arrangement of prior art.

FIG. 1 shows a triaxial capacitive sensor controlled by a floating bridge electronics such as described in prior art document FR2756048. The capacitive sensor includes a measurement electrode 2 and a guard electrode 3. It also includes a ground 25. The ground 25 is connected to the general ground 10, which may be Earth. The measurement electrode 2 is connected though a conductor 6 to an excitation and capacitive measurement circuit, or capacitance meter 15. The capacitance meter 15 measures the capacitance between the electrode 2 and an object 11 coupled with the general ground 10.

The particularity of the floating bridge electronics described in FR2756048 is that it includes a floating part 7 referenced to the potential 17 of the guard 3 to which it is connected through a conductor 5. Preferably, the conductors 5, 6 as well as the ground 25 are gathered as a triaxial cable wherein the conductors are concentrically arranged. The guard 3 is excited at an alternating electric potential at a fixed frequency by the electronics 7. The measurement electrode 2 is also maintained at this potential. The floating part 7 of electronics is powered by a DC/DC direct voltage converter 16 referenced on its output side to the guard potential 17. The measurement signals output from the capacitance meter 15 are transferred to the electronics referenced to the general ground 10 by a differential amplifier 18.

The guard 3 protects the electrode 2 from external electric influences precisely because it is maintained at the same potential as the latter. There is no capacitive coupling between the guard 3 and the electrode 2 and the electrostatic field lines 26 from the electrodes 2 remain oriented all perpendicularly to the surface of the latter, which allows the sensitivity of the sensor, thus its range to be optimised. In the case of a capacitive coupling, as for example between the guard 3 and the ground 25, the electrostatic field lines 27 become strongly curved.

Figure 2:
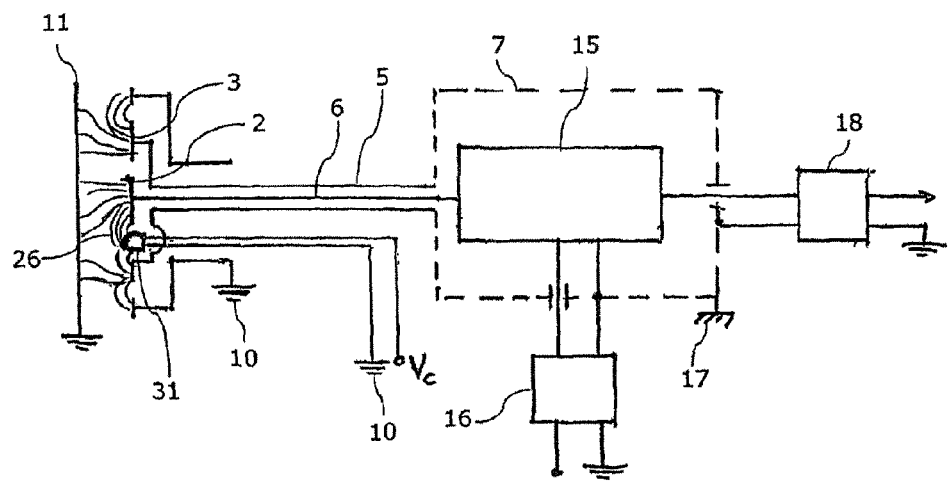
FIG. 2 illustrates the structure of the electric field lines of a triaxial capacitive sensor to which has been added an external component connected to the general ground adjacent to the measurement electrode, according to a representative arrangement of prior art.

FIG. 2 illustrates the case, representative of prior art, of what happens when a component 31 referenced to the general ground 10 is introduced adjacent to the capacitive electrode 2. In the example of FIG. 2, a LED 31 is added between the measurement electrode 2 and the guard 3. This LED 31 is driven by an external electronic circuit referenced to the general ground 10, which applies a Vc voltage to it to switch it on.

The natural path of the electrostatic field lines from the electrode 2 is deflected by the LED 31 which is at the same ground as the object 11 for the excitation frequency and thus behaves as a stray target. The field lines 26 of the electrode 2 are partially attracted by this LED 31, which strongly reduces its sensitivity towards the target 11. The performances of the sensor are directly altered by this.

Of course, the example of the LED is in no way limiting and this reasoning is valid for any component 31 referenced to a potential different from the guard at the excitation frequency.

Figure 3:
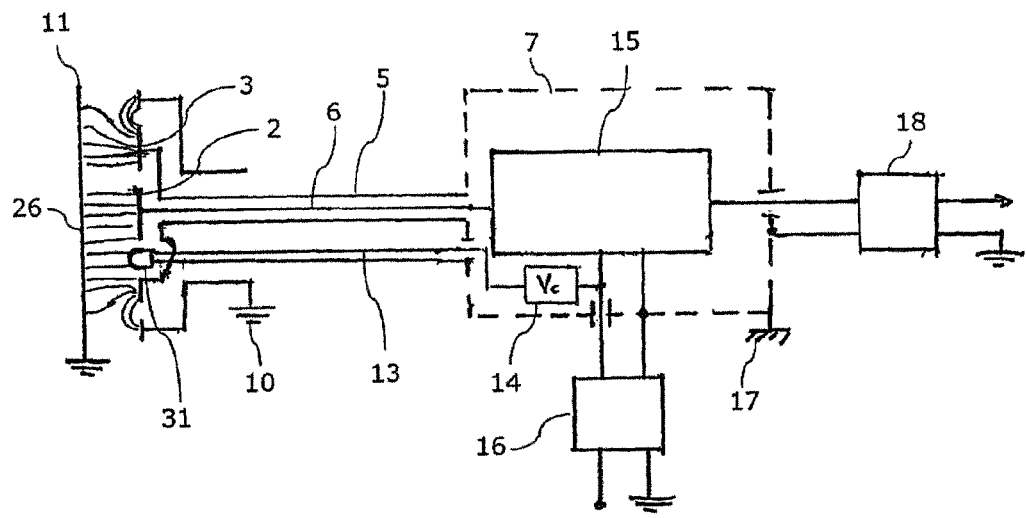
FIG. 3 illustrates a first embodiment of the device according to the invention implementing a triaxial capacitive sensor.

FIG. 3 shows an embodiment of the device according to the invention, wherein a function is added, here for example a LED 31, in the sensor adjacent to the electrode 2. In accordance with the present invention, the LED 31 is connected through a wire 13 to a control electronics 14 which is floating and integrated to the part 7 of the electronics being referenced to the potential of the guard. This control electronics 14 is for example a voltage generator enabling the LED to be switched on. A decoupling capacitor is inserted in parallel with the LED 31, in order to remove any residual voltage at its terminals at the excitation frequency. The control electronics 14 can be powered by the floating power supply 16.

Advantageously, the path of the electrostatic field lines 26 is no longer deflected by the LED 31 which is, for the excitation frequency, at the guard potential 17 and thus behaves as a guard element 3. As regards the capacitive measurement, the sensor is thus not altered by the presence of the LED 31.

Figure 4:
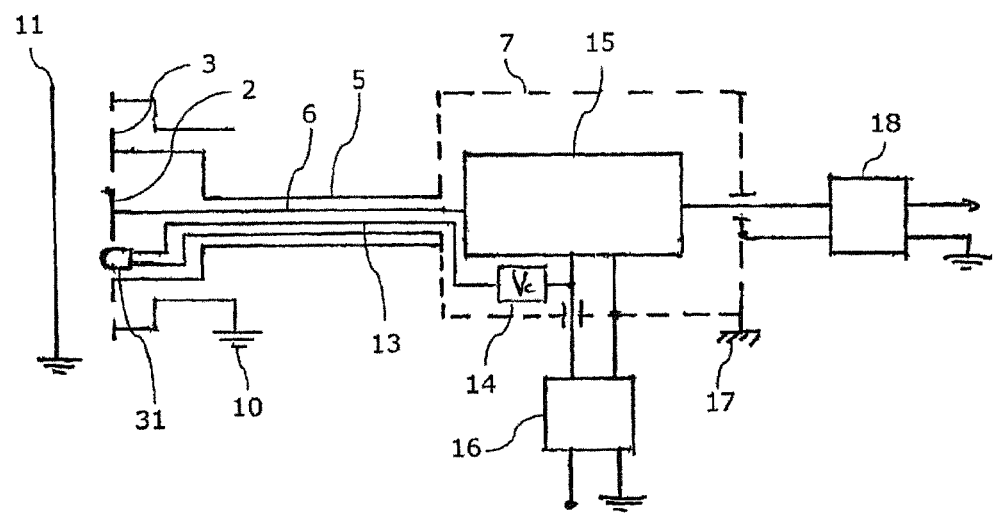
FIG. 4 illustrates a second embodiment of the device according to the invention implementing a triaxial capacitive sensor.

FIG. 4 shows another embodiment of the device according to the invention, wherein the wiring 13 of the LED 31 passes through the connecting cable of the capacitive sensor, which in this case is a triaxial cable having a core with several strands. This embodiment illustrates the integration possibilities provided by the device according to the invention, because the further components do not disturb any longer the sensor. In the example of FIG. 4, only one single connecting cable is used for the capacitive sensor and the further function(s).

Figure 5:
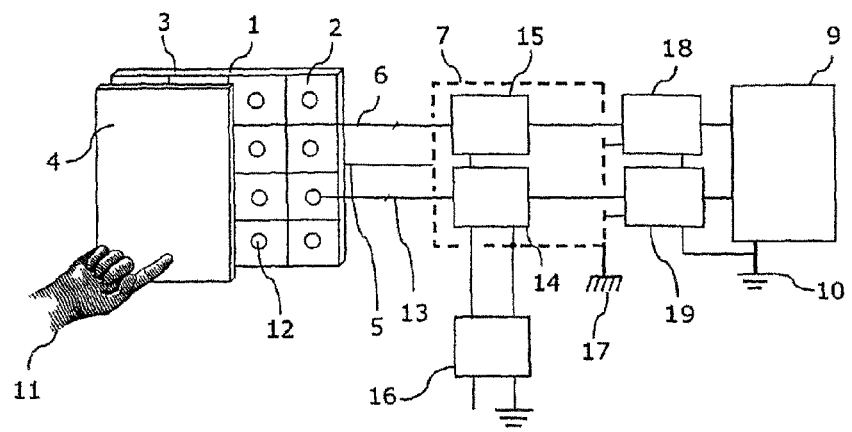
FIG. 5 illustrates a first embodiment of the device according to the invention implementing an array of capacitive sensors.

FIG. 5 shows an embodiment of the device according to the invention including a plurality of capacitive sensors arranged as an array. This device can for example be used as a control panel. The capacitive sensors are made on a double-sided flexible printed circuit 1. The measurement electrodes 2 are etched on one of the faces of the printed circuit 1, whereas the second face of the circuit supports a guard electrode 3. The plate 1 also supports LEDs 12, provided in the centre of the electrodes 2.

A plate 4 of dielectric material, for example in silicone, is placed in front of the electrodes 2, so as to be in contact with their active surface.

The plate 1 is connected to the part 7 of the electronics, which is floating with respect to the general ground 10 and referenced to the alternating potential of the ground 17. The guard electrode 3 is connected to this potential through the electric link 5. Each electrode 2 is connected by an electric link 6 to the excitation and measurement electronics (or capacitance meter) 15. The electrodes 2 are also maintained at the electric potential 17 of the guard. The LEDs 12 are connected to a driving electronic circuit 17 by electric links 13. These LEDs 12 and their driving circuit 14 are also referenced to the electric potential of the guard 17.

The electronics for driving and controlling the capacitive measurement electrodes 15 is also described in document FR2756048. It enables the distance between each electrode 2 and an approaching object 11 to be measured, by measuring the capacitive coupling between the electrode 2 and the object 11. This distance measurement also enables the contact between the object 11 and the surface of the dielectrics 4, as well as the depression of the object 11 into the dielectrics following the application of a pressure to be detected. The capacitance meter 15 includes a multiplexer enabling the electrodes 2 to be sequentially interrogated, whereas the inactive electrodes are maintained at the guard potential 17.

The floating part 7 of the electronics is powered by at least one DC/DC voltage converter 16 referenced on the output side to the guard potential 17. The measurement signals output from the capacitance meter 15 are transferred to the circuit 9 referenced to the general ground 10 by a differential amplifier 18.

The circuit for driving the LEDs 14 is driven from the part of the electronics 9 that is referenced to the general ground through optocouplers 19.

Figure 6:
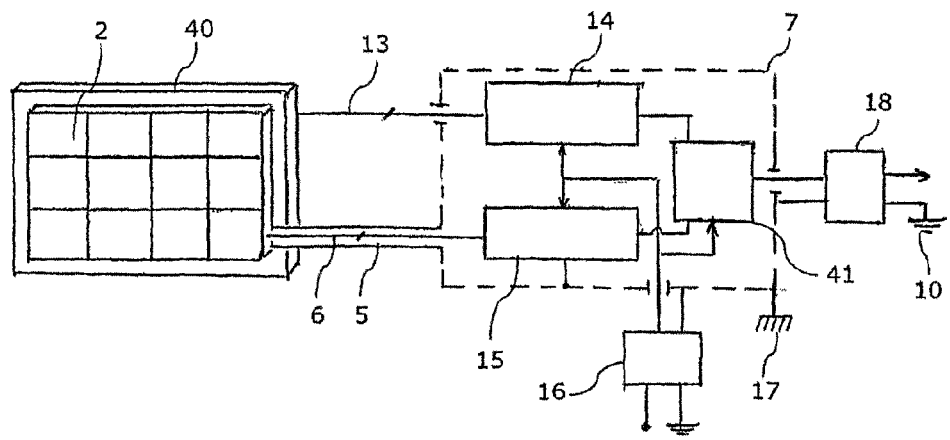
FIG. 6 illustrates a second embodiment of the device according to the invention implementing an array of capacitive sensors.

FIG. 6 shows another embodiment of the device according to the invention including a plurality of capacitive sensors disposed as an array, wherein a control panel equipped with transparent capacitive electrodes 2 of ITO (indium tin doped oxide) is placed above a display screen 40. The display screen 40 is driven by an electronics 14 referenced to the same floating potential 17 of the guard as the capacitance meter 15. Advantageously, the display 40 appears as a whole at the floating potential of the guard 17 at the excitation frequency, and can thus be used as a guard screen 3. The transparent capacitive electrodes 2 can thereby be directly deposited above the display 40 without degrading the sensitivity and range of the sensors.

According to non-limiting particular embodiments, the DC/DC supply converter 16 can be replaced by a cheaper power supply referenced to the general ground 10, and coupled to the floating circuit 7 through "choke coils", the output differential amplifiers 18 and/or 19 can be replaced by optocouplers or choke coils, the incoming signals, from the electronics 9 referenced to the ground 10 can be transmitted to the electronics 14 for controlling further functions through optocouplers or choke coils 19.

Of course, the invention is not limited to the examples just described and numerous improvements can be made to these examples without departing from the scope of the invention.

The invention claimed is:

1. A capacitive control interface device comprising:
   at least one measurement electrode including an active surface;
   a guard made from an electrically conductive material placed adjacent to said at least one measurement electrodes which guard is excited up to an alternating electric potential substantially identical to that of the at least one measurement electrode;
   first electronic means for exciting the at least one electrode and processing the measurement signals from the capacitive coupling of said at least one electrode with an object placed adjacent thereto, which electronic means are at least partly referenced to the electric potential of the guard;
   second electronic means for performing a display, placed adjacent to said active surface, and at least partly referenced to the electric potential of the guard.

2. The device according to claim 1, wherein the second electronic means comprises a display screen.

3. The device according to claim 2, wherein the display screen comprises at least one of the following components:
   liquid crystals (LCD),
   organic light emitting diodes (OLED).

4. The device according to claim 2, which comprises a plurality of measurement electrodes placed above, according to the front face, of the display screen.

5. The device according to claim 4, wherein the measurement electrodes are disposed as an array.

6. The device according to claim 2, wherein the display screen is driven by second electronic means referenced to the electric potential of the guard, and is used as a guard.

7. The device according to claim 6, which comprises measurement electrodes directly deposited above the display screen.

8. The device according to claim 1, which comprises transparent measurement electrodes in ITO.

9. The device according to claim 1, wherein the first electronic means include scrutinizing means enabling the measurement signals from the measurement electrodes to be sequentially read, the electrodes which are not being scrutinized being connected to the potential of the guard.

10. The device according to claim 1, wherein the electronic means include means for electrically gathering the measurement electrodes, such that said gathered electrodes make up a single measurement electrode.

11. The device according to claim 1, wherein the second electronic means include decoupling means, such that at the guard excitation alternating electric potential frequency, they appear to be substantially at this same potential.

12. The device according to claim 1, wherein at least one part of the electronic means referenced to the electric potential of the guard is integrated on the same support as the measurement electrodes.

13. The device according to claim 1, wherein at least one part of the electronic means referenced to the electric potential of the guard is substantially provided in a plane consisting of the active surface of at least one part of the measurement electrodes.

14. The device according to claim 1, which further includes a dielectric material provided on the active surface side of the measurement electrodes.

15. An apparatus integrating a control interface device of a tactile screen type according to claim 1.

16. The apparatus according to claim 15, being a smartphone type.

* * * * *